(12) United States Patent
Pullini et al.

(10) Patent No.: US 7,352,178 B2
(45) Date of Patent: Apr. 1, 2008

(54) NANOSTRUCTURED MAGNETORESISTIVE NETWORK AND CORRESPONDING METHOD FOR DETECTION OF MAGNETIC FIELD

(75) Inventors: Daniele Pullini, Orbassano (IT); Antonio Ruotolo, Orbassano (IT)

(73) Assignee: C.R.F. Società Consortile per Azioni, Orbassano (Turin) (IT)

( * ) Notice: Subject to any disclaimer, the term of this patent is extended or adjusted under 35 U.S.C. 154(b) by 0 days.

(21) Appl. No.: 11/503,265

(22) Filed: Aug. 14, 2006

(65) Prior Publication Data

US 2007/0090835 A1    Apr. 26, 2007

(30) Foreign Application Priority Data

Oct. 26, 2005    (IT)  .......................... TO2005A0759

(51) Int. Cl.
*G01R 33/02* (2006.01)
(52) U.S. Cl. ................. 324/252; 324/207.21; 324/249; 977/953
(58) Field of Classification Search ................ 324/244, 324/249, 252, 260, 207.21; 977/700–701, 977/810, 838, 953, 960
See application file for complete search history.

(56) References Cited

U.S. PATENT DOCUMENTS

| | | | |
|---|---|---|---|
| 3,813,660 A | 5/1974 | Buhrer | |
| 3,838,406 A | 9/1974 | Cohen et al. | |
| 4,159,537 A | 6/1979 | Schwartz | |
| 5,552,706 A | 9/1996 | Carr | |
| 5,936,402 A * | 8/1999 | Schep et al. ................. 324/252 |

FOREIGN PATENT DOCUMENTS

EP    0 675 371    10/1995

* cited by examiner

*Primary Examiner*—Bot LeDynh
(74) *Attorney, Agent, or Firm*—Nixon & Vanderhye P.C.

(57) ABSTRACT

Described herein is a magnetoresistive network responsive to a magnetic field of the type comprising a plurality of magnetoresistive elements. According to the invention, the one or more magnetoresistive elements comprise at least one magnetoresistive element in the form of nanoconstriction, the nanoconstriction comprising at least two pads made of magnetic material, associated to which are respective magnetizations oriented in directions substantially opposite to one another and connected through a nanochannel, the nanochannel being able to set up a domain wall that determines an electrical resistance of the nanoconstriction as a function of the position, with respect to said nanochannel, of said domain wall formed in said sensor device.

24 Claims, 11 Drawing Sheets

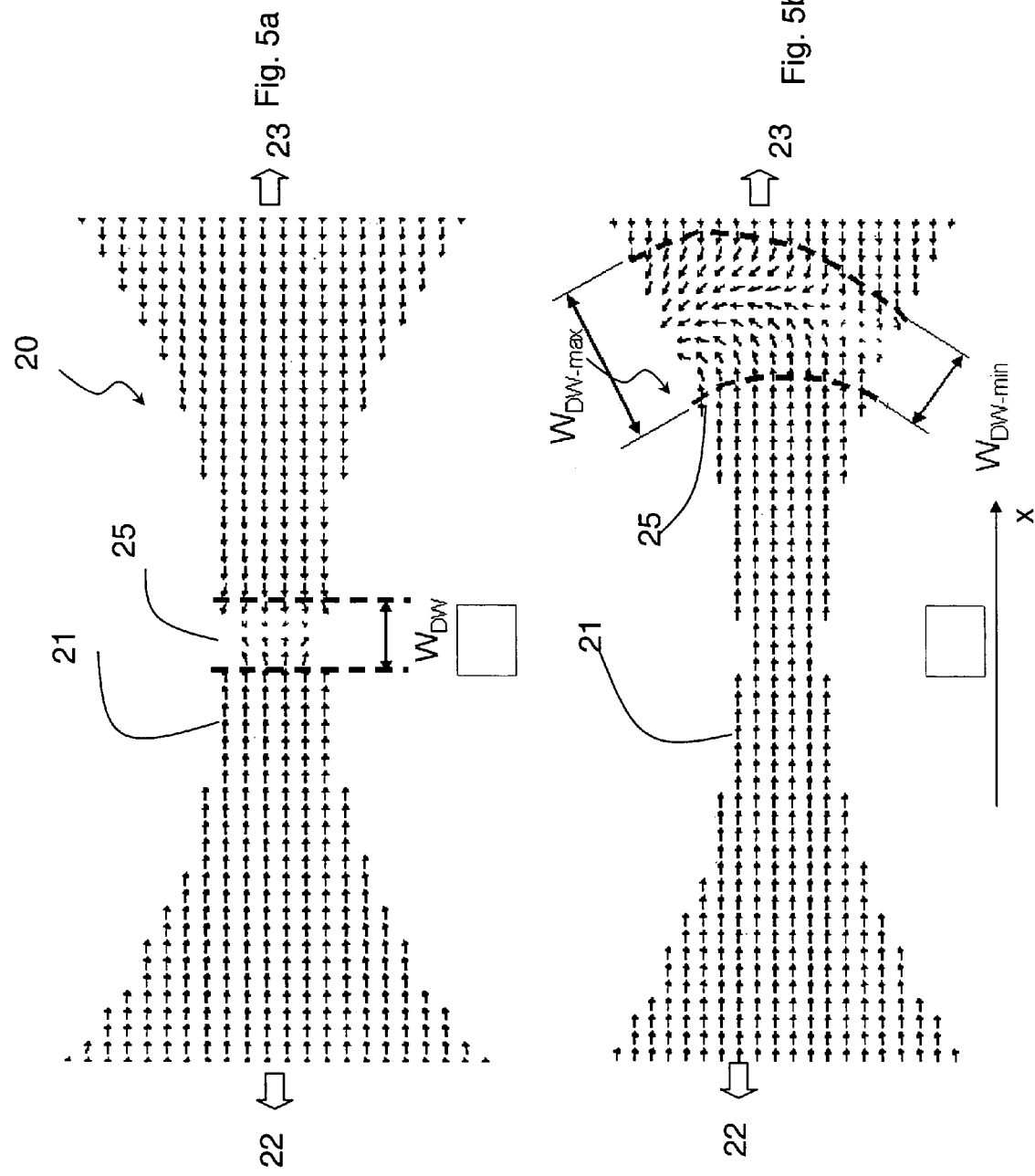

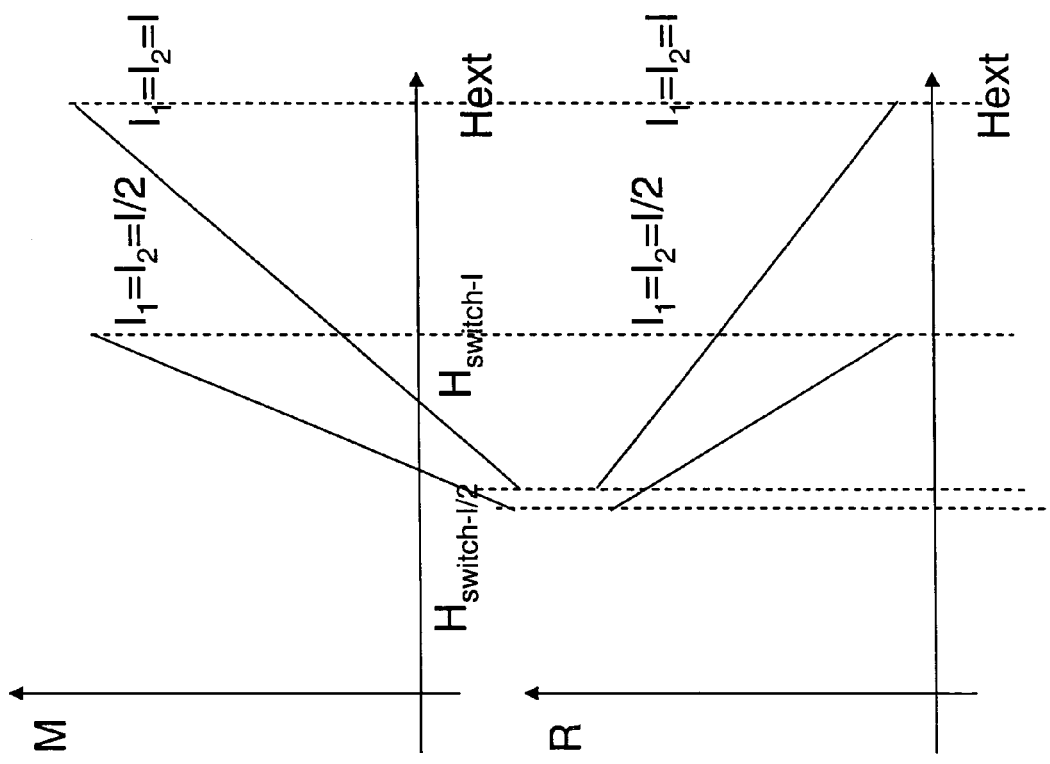

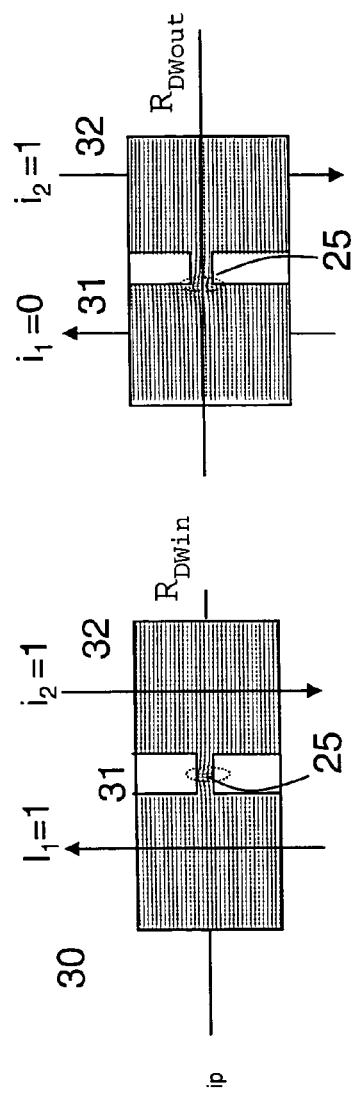
Fig. 12a
Fig. 12b
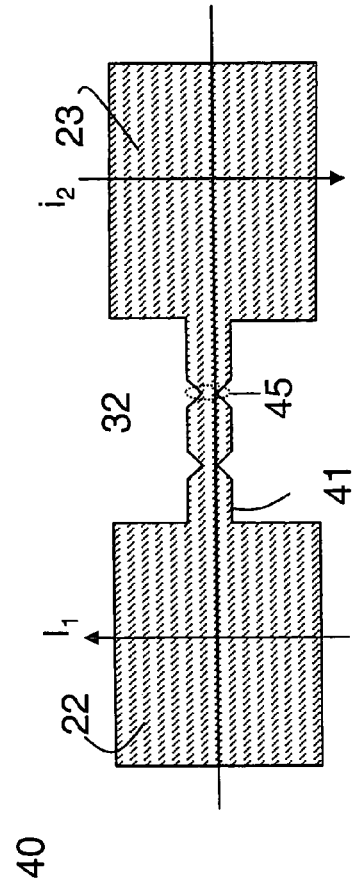
Fig. 13

NANOSTRUCTURED MAGNETORESISTIVE NETWORK AND CORRESPONDING METHOD FOR DETECTION OF MAGNETIC FIELD

The present invention relates to a magnetoresistive network responsive to a magnetic field of the type comprising a plurality of magnetoresistive elements of nanometric dimensions.

Magnetometric apparatuses are known that make use of a plurality of magnetoresistive elements connected according to different schemes, for example in series or in parallel, for the purpose of increasing the sensitivity of the magnetometer.

For example, from the document U.S. Pat. No. 5,552,706 a magnetic-field sensor of a magnetoresistive type is known, which is provided with a much longer active region and obtains a transduction signal of adequate power without any need for increasing the voltage or the current density. This is obtained by splitting the sensor into a multiplicity of multiple sub-elements which are connected in parallel. The transduction signal is produced by the sum of the variations of voltage induced by a magnetic field through each of the magnetoresistive sub-elements.

Said solution, however, presents the drawbacks of being far from flexible and adaptable to different conditions of magnetic field in so far as the sub-sensors present characteristics similar to one another.

The purpose of the present invention is to propose a solution capable of providing a magnetoresistive network based upon a plurality of magnetoresistive elements which presents a characteristic of detection that can be easily adapted by regulating parameters of one or more of said magnetoresistive elements.

According to the present invention, said purpose is achieved thanks to a magnetoresistive network and to a corresponding method for detecting a magnetic field having the characteristics recalled specifically in the ensuing claims.

The invention will now be described with reference to the annexed plate of drawings, provided purely by way of non-limiting example, in which:

FIGS. 5a and 5b represent a working diagram of the second embodiment of a magnetoresistive element according to the invention;

FIGS. 6c, and 6d represent diagrams which illustrate conditions of operation of the variant of the embodiment of the magnetic-field sensor device according to the invention.

Figure 7:
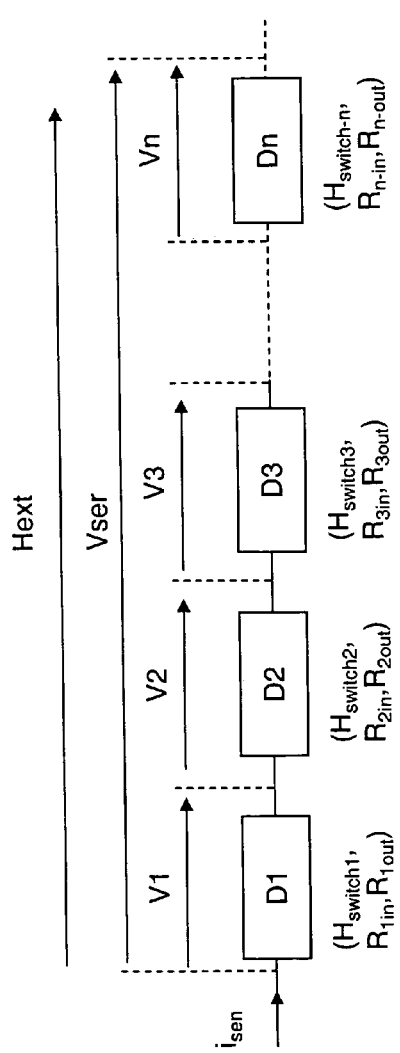
Figure 10:
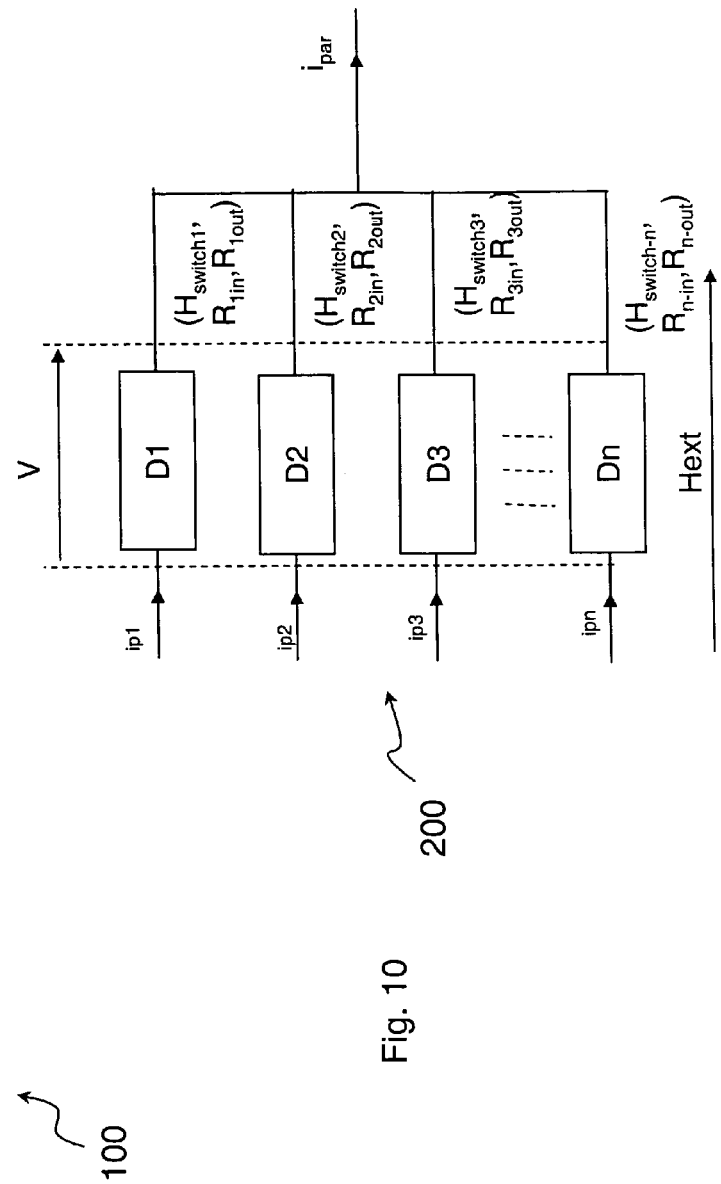
Figure 9:
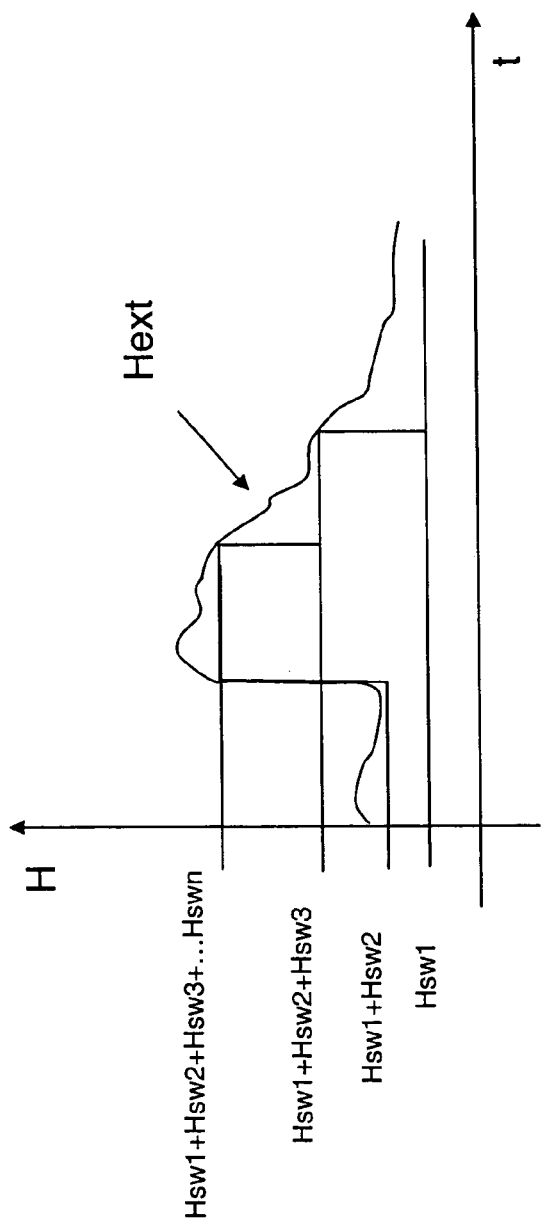
Figure 8:
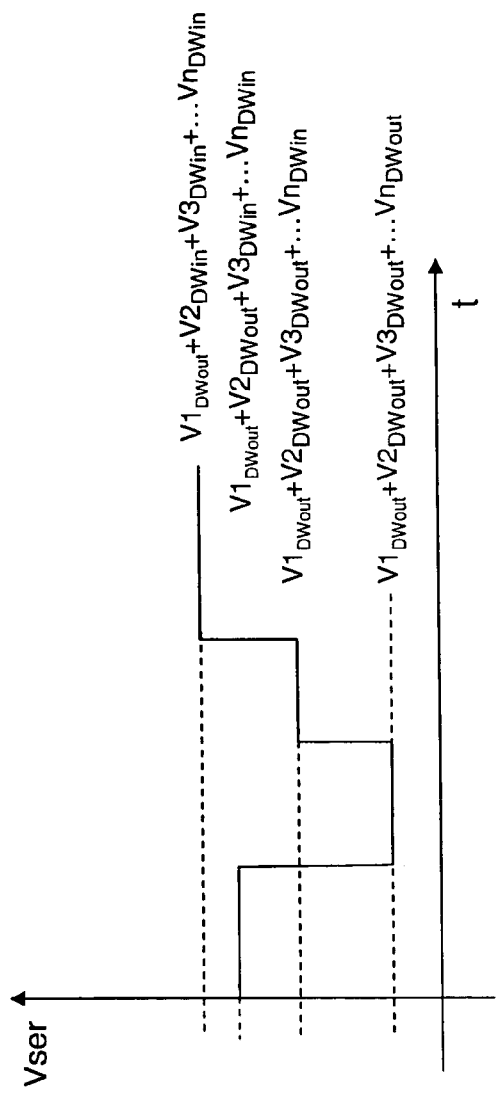
Figure 11:
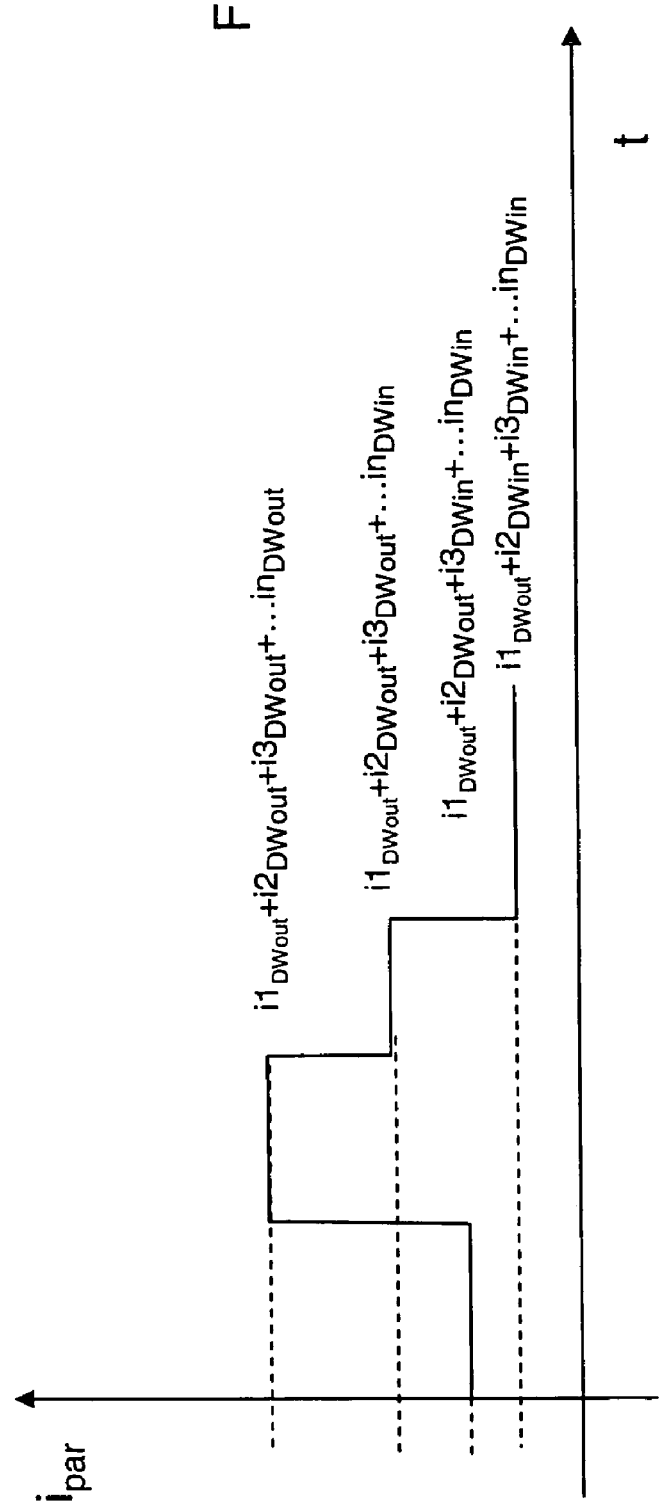

FIG. 7 illustrates a first embodiment of a magnetometric apparatus based upon a structure of connection in series;

FIGS. 8 and 9 represent time graphs of quantities corresponding to the first embodiment of the magnetometric apparatus of FIG. 7;

FIG. 10 represents a second embodiment of magnetometric apparatus based upon a structure of connection in parallel; and FIG. 11 represents time diagrams of quantities corresponding to the second embodiment of the magnetometric apparatus illustrated in FIG. 10.

FIGS. 12a and 12b show how the sensor device executes substantially a logic function XOR.

FIG. 13 shows a possible embodiment of a memory element.

The magnetoresistive network proposed is based upon the use of magnetoresistive elements that comprise a nanoconstriction, i.e., substantially a nanometric structure comprising two pads made of ferromagnetic material associated to which are respective magnetizations oriented in directions substantially opposite to one another and connected through a nanochannel. Said nanochannel is able to set up a domain wall, which determines a pattern of the electrical resistance of the nanoconstriction as a function of the position, with respect to said nanochannel, of said domain wall formed in said magnetoresistive element.

Said structures can be produced with techniques of electron-beam lithography or with focused ion beam having a size of around 10 nm.

In particular, here reference is made to the electrical resistance determined by a domain wall confined in a nanochannel, i.e., in an electrical path, made of ferromagnetic material, that is very thin and has a cross section of nanometric dimensions.

In what follows, the term "nanoconstriction" is, instead, used to indicate the structure comprising said nanochannel substantially in the form of constriction of nanometric dimensions between pads having wider sections or dimensions, i.e., for example, a structure consisting of two magnetic electrodes connected by a magnetic wire of nanometric length and with a cross section of just a few nanometers. It is known, in fact, that in a nanoconstriction made through anisotropic magnetic materials such as cobalt, iron, nickel and LSMO (Lanthanum and Strontium Manganate) it is possible to trap a domain wall, this resulting in a reduced conductance of the nanoconstriction itself, a fact that determines a positive domain-wall (DW) resistance.

Figure 1A:
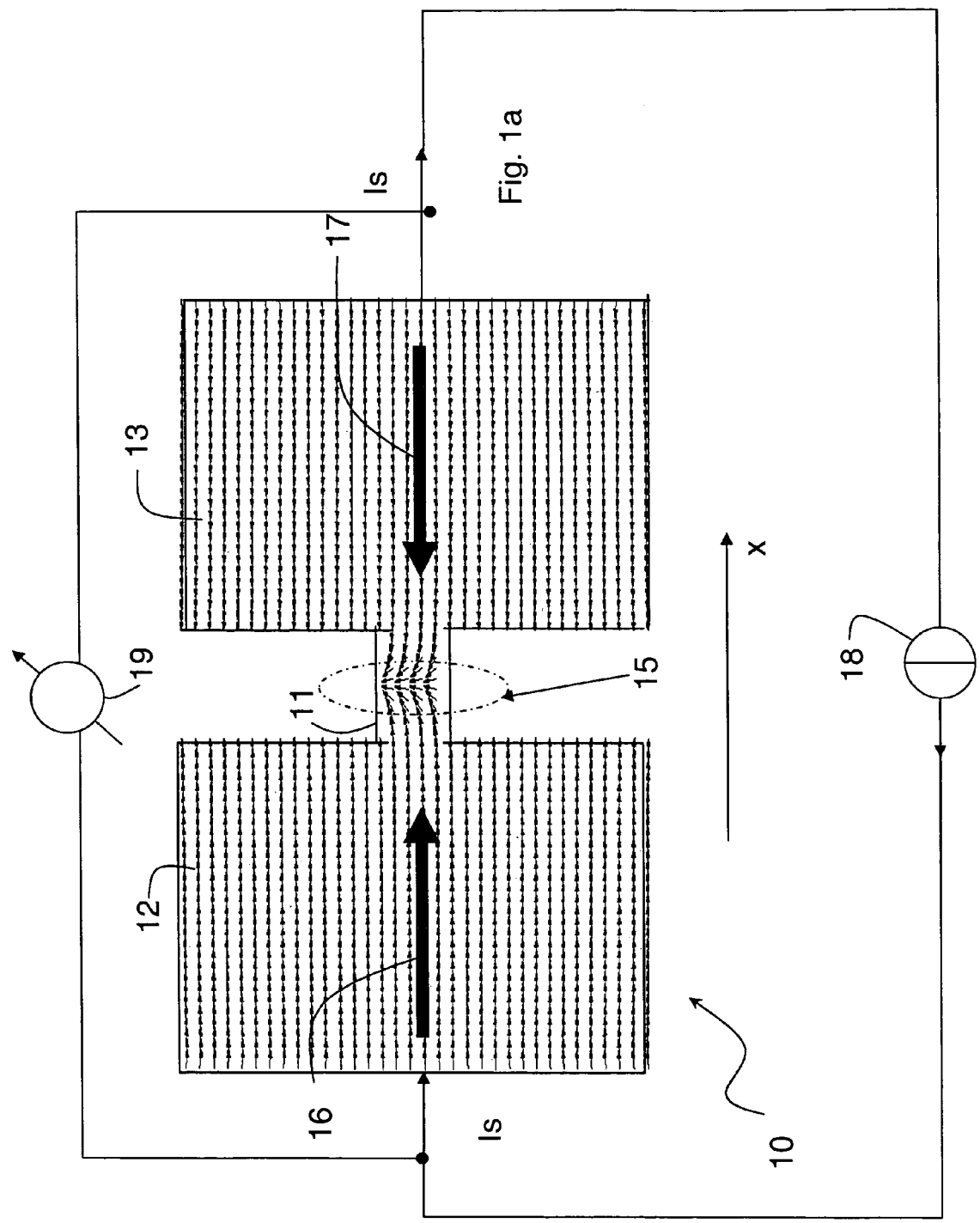
FIGS. 1a, 1b, 1c, represent a working diagram of a first embodiment of a magnetoresistive element designed to operate in the magnetoresistive network according to the invention.

FIG. 1a represents a nanoconstriction-structure device designated as a whole by the reference number 10, which comprises a first ferromagnetic pad 12 and a second ferromagnetic pad 13 joined by a nanochannel 11. Highlighted in the nanochannel 11 is the presence of a magnetic domain wall 15.

The device 10 has a resistance that can be measured, for example, by forcing a measurement current Is via a current generator 18 and measuring the voltage drop determined by the device 10 using a voltmeter 19.

1. As has been said above, a resistance, referred to also as DW resistance, may be ascribed to the magnetic domain wall 15. This resistance is due, in the first place, to the phenomenon of electron scattering, or diffusion, which takes place to a larger extent when an electron that has the spin oriented in a certain direction passes through a material magnetized in a direction different from that of the spin. In a domain wall, the local magnetization changes direction, so that the domain wall 15 represented in FIG. 1a precisely constitutes the junction area between two parts of material magnetized in different directions. Electron scattering is a function of the magnetization gradient, i.e., of how rapidly the magnetization varies along the line of path of the electrons. If the magnetization gradient is high, the local magnetization varies rapidly, and hence the thickness of the magnetic domain wall is small. As has been demonstrated in the past, the resistance of a wall depends upon the inverse of its thickness. The thinner a wall, the higher its electrical resistance; in this connection, see, for example, the paper published by G. G. Cabrera and L. M. Falicov, 1974, in Phys. Status Solidi (b) 61, 59.

Figure 1B:
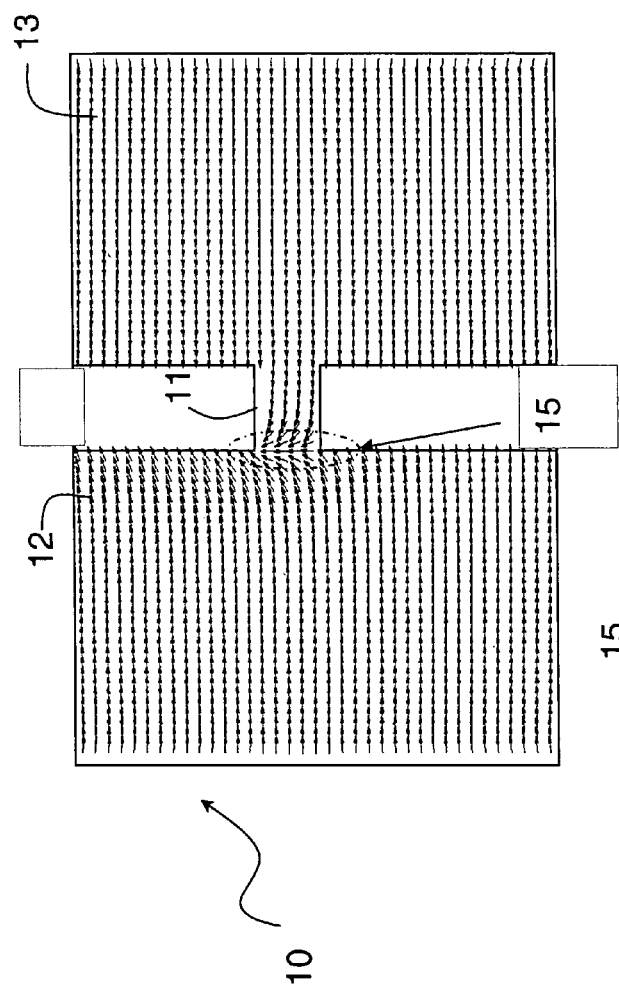
Figure 1C:
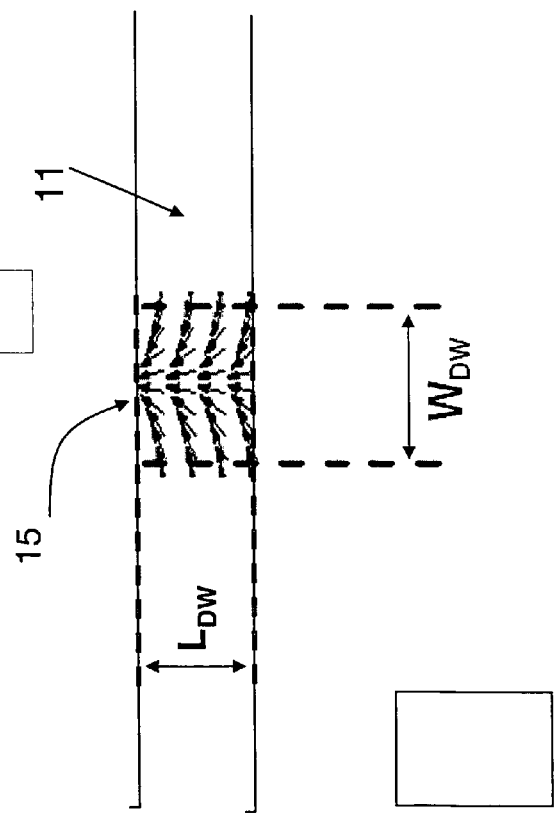

FIG. 1c shows a detail of the nanochannel 11, from which there may be noted a thickness $W_{DW}$ of the domain wall 15, as well as a length $L_{DW}$ of the domain wall 15, which is, in effect, equal to the width of the nanochannel 11. It is, in fact, the width of the nanochannel 11 that determines the length $L_{DW}$ of the domain wall 15; if the nanochannel were wider, the domain wall would be longer—see P. Bruno Phys. Rev. Lett. 83, 12, pp. 2425-2428, (1999).

In addition to the effect described above due exquisitely to electron scattering at the wall, i.e., to the resistance of the domain wall as such, there is an additional effect produced by the wall 15, referred to as "spin accumulation". Said phenomenon is known also in relation to spin-valve devices.

In a single homogeneous material, the ends of which are magnetized, for example, in opposite directions, as occurs in FIG. 1a with the pads 12 and 13, where the opposite directions of magnetization are indicated by the arrows 16 and 17, there is naturally formed a magnetic wall, namely, the wall 15, which presents a resistance to the motion of the electrons. The electrons that enter the pad 12 from the left are biased in the direction indicated by the arrow 16. When they encounter the wall 15, they are scattered because they enter an area magnetized in the opposite direction. This constitutes the contribution to the resistivity of the magnetic wall 15 due to electron scattering. Furthermore, the fact that in the proximity of the magnetic wall 15 the electrons biased in the pad 12 are forced to slow down on account of the resistance of the wall 15, determines an accumulation of charge in the proximity of the wall itself, which is referred to as "spin accumulation". The electrons that follow are then further slowed down by the accumulation of charge of the same sign. This is the contribution to the resistivity of the magnetic wall 15 due the phenomenon of spin accumulation. Said effect has been observed, for example, experimentally in cycles of magnetoresistive hysteresis in cobalt wires having a section of 35 nm, as illustrated in the paper published by U. Ebels et al. in Phys. Rev. Lett. 84, 5, pp. 983-986, (2000).

Figure 2:
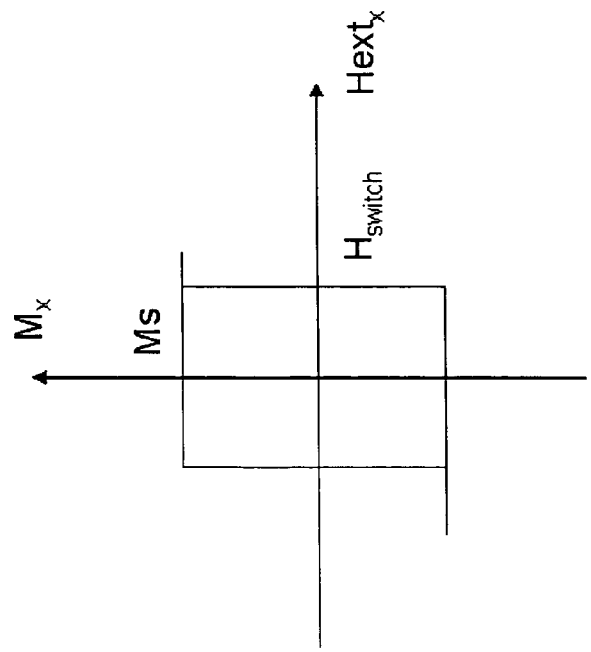

The magnetization cycle of the device 10 of FIG. 1a is schematically illustrated in the diagram of FIG. 2, which shows a magnetization $M_x$ of the nanoconstriction 10 along an axis x parallel to the direction of the nanochannel 11 of an external magnetic field $H_{extx}$. $M_s$ indicates the value of saturation magnetization of the nanochannel 11, corresponding to the condition in which the magnetic moments, each corresponding to a single magnetic dipole, are all oriented in the direction of the external field. $H_{switch}$ indicates the value of switching field, i.e., the field necessary for orienting the magnetization of the nanochannel from one direction to the other. The fact that the magnetization cycle of FIG. 2 corresponding to the device of FIG. 1a presents a steep slope around the switching field indicates that the nanochannel with constant cross section is remagnetized completely when the switching field is reached.

In order to provide a magnetic-field sensor with given properties, alongside the hysteresis cycle shown in FIG. 2, it is important to evaluate the magnetoresistance cycle, which describes how the conductivity of the device, and in particular of the nanochannel, which determines it to a large extent, varies as a function of the external magnetic field.

Figure 3:
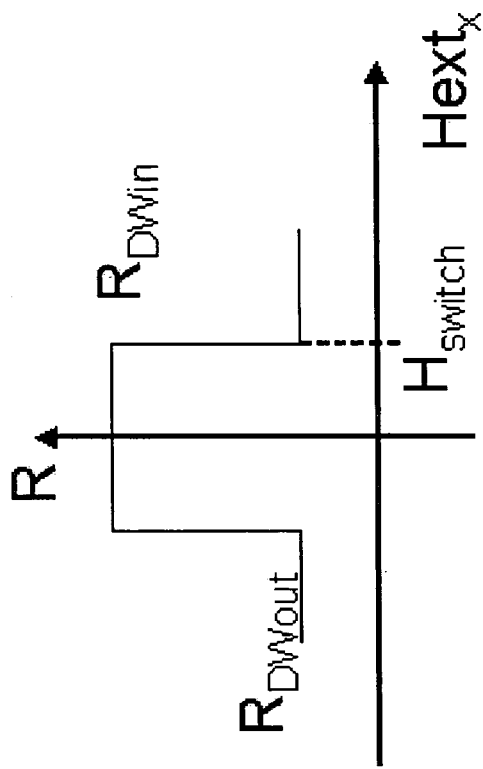
FIGS. 2 and 3 represent diagrams illustrating curves of operation of the first embodiment of a magnetoresistive element.

In the diagram of FIG. 3, which gives the resistance of the nanoconstriction 10 as a function of the external magnetic field $H_{extx}$, a value of resistance of the device $R_{DWin}$ is shown, corresponding to the condition in which the magnetic wall 15 is located within the nanochannel 11, as in FIG. 1a. The value $R_{DWout}$ corresponds, instead, to the resistance of the device when the magnetic wall 15 is located outside the nanochannel 11, as represented in FIG. 1b, where the wall is shown still within the nanochannel 11 but about to exit therefrom following upon a further increase in the external magnetic field $H_{extx}$ in the same direction along the axis x.

A device like the one described in relation to FIGS. 1a-1c, distinguished by the magnetoresistive characteristic shown in FIG. 3, is, in itself, less efficient as magnetic-field sensor, in so far as it switches between the values of resistance $R_{DWin}$ and $R_{DWout}$, whilst, it is suited, rather, for operating as elementary storage device, in so far as it is bistable.

Figure 4:
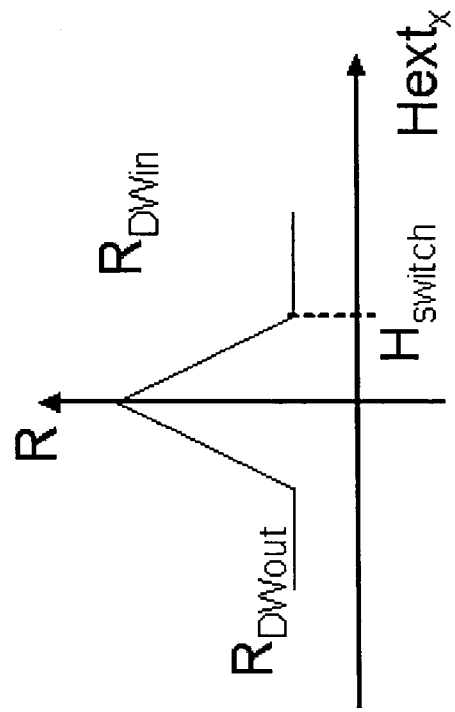
FIG. 4 represents a diagram which illustrates a curve of operation of a second embodiment of a magnetoresistive element.

However, it could also be desirable to have available a magnetoresistive characteristic with less sharp transitions between the values of resistance $R_{DWin}$ and $R_{DWout}$, such as the one shown in FIG. 4.

Said characteristic, shown in FIG. 4, can be obtained by means of an appropriate shaping of the cross section of the nanochannel, which, as compared to the nanochannels with constant cross section, is hence rendered variable in the direction of the length of the nanochannel.

Said magnetic-field sensor device with variable-section channel may comprise, in particular, a nanochannel made of ferromagnetic material of any appropriately designed shape, with a length of between 30 nm and 1000 nm, a width of between 1 nm and 100 nm, and a thickness of between 1 nm and 100 nm, applying the micro-magnetism model (Landau-Lifshitz-Gilbert equations) in order to position the wall within the nanochannel as a function of the external magnetic field over a range of preferably 1 oersted to 50000 oersted. The magnetic domain wall must be able to position itself as a function of the external field in different points of the nanochannel.

The sensor device according to the invention enables, instead, displacement of the domain wall along the nanochannel for wide variations of the external magnetic field (wide dynamic range), by appropriately designing, in terms of shape and dimensions, the pads. In general, the shape and size of the nanochannel, as also the shape and size of the pads, all play a part, by magnetostatic interaction, in defining the characteristic ranges of the magnetization and magnetoresistive cycles, in terms of coercive, saturation, and remanence fields, and slope and shape of each segment of said cycles.

In this connection, FIG. 5a represents a nanoconstriction-structure device, designated as a whole by the reference number 20, which comprises a first ferromagnetic pad 22 and a second ferromagnetic pad 23 (only illustrated schematically in FIG. 5a), joined by a nanochannel 21 of variable cross section, the width of which coincides with the length $L_{DW}$; i.e., it varies from a minimum value at the centre of the nanochannel 21 to a maximum value at the two ends of the nanochannel 21, where said nanochannel 21 gives out onto the first ferromagnetic pad 22 and onto the second ferromagnetic pad 23. Highlighted in the nanochannel 21 is the presence of a magnetic domain wall 15.

Since the profile of the nanochannel 21 is not linear, i.e., its section, or width (which coincides with the length of the wall, $L_{DW}$), is variable, even though the position at the centre of the nanochannel 21 still corresponds to an energy minimum (condition of stability), under the stress of the external field $H_{extx}$ a wall 25 can move away from the centre migrating slowly, guided by the external field $H_{extx}$, and then return to the centre of the nanochannel 21 itself as soon as the external field $H_{extx}$ ceases.

Both electron scattering and spin accumulation produced by a magnetic wall depend upon the thickness of the wall itself, and, in particular, the electrical resistance produced by a wall is inversely dependent upon the thickness of the wall. The thickness $W_{DW}$ of a magnetic wall depends also upon its length $L_{DW}$, which corresponds to the thickness, or width, of the nanochannel, as may be also seen with reference to FIG. 1c; consequently, a nanochannel of variable cross section, like the nanochannel 21, enables modification of the thickness $W_{DW}$ of the wall 25 by means of the external field $H_{extx}$ as the wall 25 displaces along the nanochannel 21.

FIGS. 5a and 5b illustrate two respective different positions and the corresponding dimensions assumed by the magnetic wall 25 when the device 20 is subjected to external magnetic fields $H_{extx}$ of different intensity, obtained through a micromagnetic simulation. Each small arrow in FIGS. 5a and 5b represents a uniform-magnetization cell with a square area of 9 nm$^2$ (3 nm×3 nm). From FIG. 5a it is possible to desume the dimensions of the geometries represented in FIGS. 5a and 5b for which the present applicant has conducted micromagnetic simulations, said simulations demonstrating the enlargement of the wall 25.

FIG. 5a represents a condition of zero external magnetic field $H_{extx}$ with a thickness $W_{DW}=12$ nm, whilst FIG. 5b represents a condition of external magnetic field $H_{extx}$ oriented from left to right along the axis x with a thickness $W_{DW}$ that ranges between a minimum value $W_{DW-min}$ of 18 nm and a maximum value $W_{DW-max}$ of 33 nm, where $W_{DW-min}$ corresponds to a wall length of approximately 30 nm and $W_{DW-max}$ corresponds to a wall length of approximately 50 nm (in the case of the non-limiting geometry of the simulation shown). A wall with variable thickness may be represented by an infinite set of resistors with variable resistance set in parallel. If, for reasons of simplicity, the wall is divided into elementary walls of constant thickness, a resistor having a higher resistance corresponds to the element with smaller thickness and vice versa. In the specific case of FIG. 5b, the elementary walls with lower resistance dominate in the parallel those with smaller thickness. Consequently, in the case represented, a wall positioned in an area further away from the centre of the nanochannel will correspond to a lower global resistance. A structure of this sort can be designed to obtain a magnetoresistance cycle having the form represented in FIG. 4.

Hence the magnetoresistance hysteresis cycle is also markedly dependent upon the geometrical shape of the nanochannel.

It should be noted that the geometry of the nanochannel with variable cross section can be defined also by varying the thickness of the nanochannel, in particular by depositing a variable-thickness film. It is also possible to carry out a three-dimensional modulation of the nanochannel, for example using devices of the current-perpendicular-to-plane (CPP) type obtained by electrodeposition in porous matrices with conical pores produced via non-collimated ion beams.

Not only the shape of the nanochannel 21, but also the materials of the nanochannel 21 and of the first ferromagnetic pad 22 and second ferromagnetic pad 23 can contribute to controlling the form of the hysteresis cycle so as to define the characteristic ranges of the magnetization and magnetoresistive cycle, the coercive, saturation, and remenance fields, and the slope and shape of each segment of said hysteresis cycles. By acting on said parameters, it is also possible to obtain forms of the hysteresis cycle that determine magnetoresistance curves that are linear, non-linear, or of arbitrary pattern.

In particular, the size of the first ferromagnetic pad 22 and of the second ferromagnetic pad 23 and the distance between them affect the mobility of the moments of magnetic dipole present in the nanochannel 21 and hence the characteristics of remagnetization of the nanochannel itself.

Figure 6A:
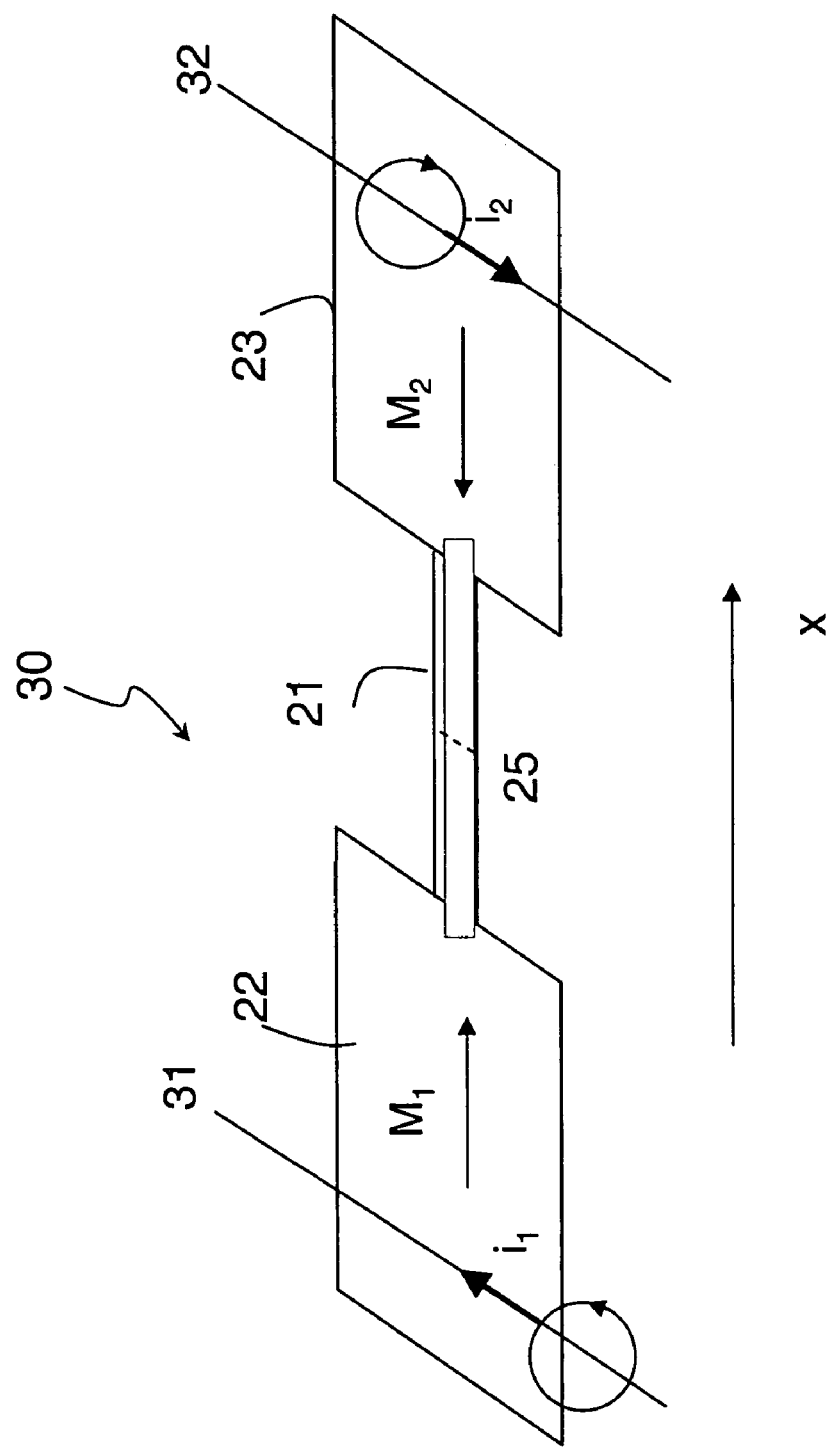
FIGS. 6a and 6b represent a working diagram of a variant of the second embodiment of the magnetoresistive element according to the invention.

FIG. 6a represents a schematic view of a variant 30 of the embodiment of magnetic sensor device 20, which comprises pinning lines 31 and 32, i.e., conductive paths set on top of the pads 22 and 23, in which respective pinning currents i1 and i2 are forced in a direction perpendicular to the direction x of the nanochannel 21. The perpendicular arrangement of the pinning currents i1 and i2 is preferred, even though it is clear to a person skilled in the sector that deviations from said condition of perpendicularity are acceptable, provided that there is a sufficient component of the current in the direction perpendicular to the axis x. In fact, around the currents i1 and i2 magnetic-field loops are generated, which induce pinning magnetizations $M_1$ and $M_2$ in the pads 22 and 23.

Figure 6B:
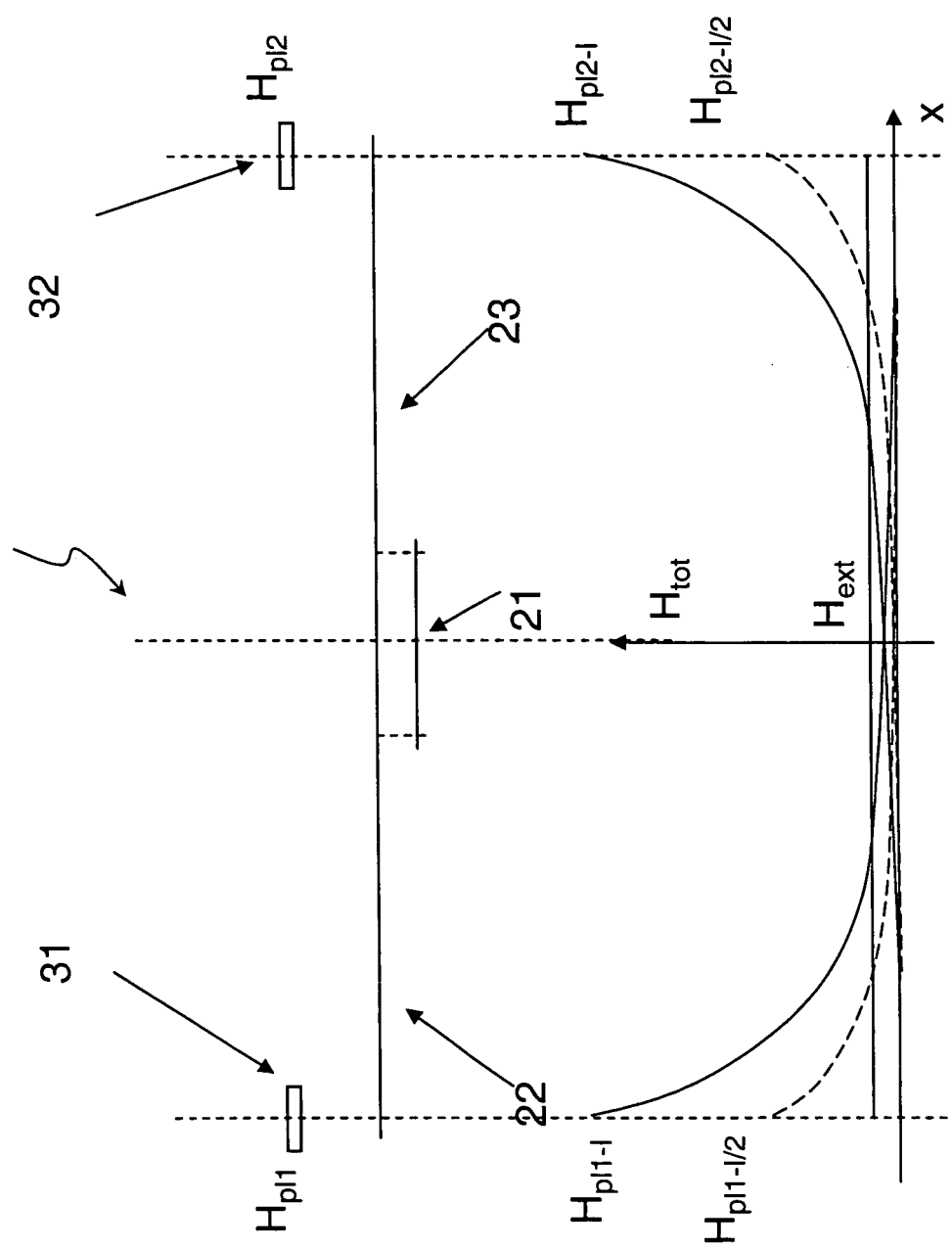

FIG. 6b shows a view set alongside a diagram that gives the external field $H_{extx}$ and the total magnetic field $H_{tot}$ in the device 30 as a function of the direction along the axis x. A case with low pinning current, i1=i2=I/2, is shown, which gives rise to magnetic pinning fields HP with maximum values $H_{pI2=I/2}$ and $H_{pI1=I/2}$ at the ends, as well as a case of a higher pinning current i1=i2=I, which gives rise to magnetic fields with maximum values $H_{pI2=I}$ and $H_{pI1=I}$ at the ends.

Should the currents in the pinning lines 31 and 32 be low, e.g., in the case where i1=i2=I/2, the fields $H_{pi2=I/2}$ and $H_{pi1=I/2}$ produced thereby are also low. Since the magnetic fields produced by the pinning lines decay with the square of the distance, and assuming the external field uniform throughout the device 30, the total field $H_{tot}$ and the local field on each individual point of the nanocontact depend upon the current in the pinning lines 31 and 32. This means that for higher currents, e.g., in the case where i1=i2=I, more intense external fields are necessary to displace the wall 25 along the nanochannel 21. According to the currents in the pinning lines 31 and 32, and to the dimensions and shape of the nanochannel 21 and of the pads 22 and 23, it is possible to displace the switching field $H_{switch}$, which is thus a function of said parameters of shape and current of the device. In other words, it is possible to move the wall 25 along the nanochannel 21 gradually without this entailing variability in the electrical resistance of the device. These cases can be appreciated if reference is made to the diagram of FIG. 6c, which gives the resistance of the device 30 as a function of the external field $H_{extx}$. When the wall 25 is at one of the two ends of the nanochannel 21, the resistance decays according to a curve of the type represented in FIG. 3.

The device 30 enables also solution of the problem of nucleation of the magnetic domain wall. In fact, the domain wall cannot exist initially or vanish. Both in the case of the device 10 of FIG. 1a and in the case of the device 20 of FIG. 5a, starting from a precise configuration of magnetization of the device, for example one in which the device is saturated in one direction or in the other, in the presence of a variable external field oriented in the direction opposite to that of magnetization of the device, it may happen that the magnetization will orient itself partially or totally in the direction of the field without any formation of a magnetic wall. Likewise, a wall that has formed may be lost because the external field saturates the device so that the device will no longer be able to detect magnetic fields.

To guarantee the presence of a magnetic wall in the device during operation, it is necessary to create it by a method of nucleation, i.e., to create the conditions of nucleation of a wall, which will subsequently assume a position of stability. The device 30 enables nucleation to be forced by means of the pinning lines 31 and 32. The passage of current in the pinning lines 31 and 32 generates a magnetic field, which magnetizes the corresponding ferromagnetic pad 22 or 23 in one way or in the other (if the current passes in the opposite direction). It is hence possible to magnetize the two pads 22 and 23 in antiferromagnetic configuration. In this configuration, there is forced nucleation of the magnetic wall 25, which will assume, in the absence of an external field, precisely a position of stability. If the structure is perfectly symmetrical, and the currents perfectly equal, the wall will position itself at the centre of the channel.

Since the film with which the nanochannel 21 is obtained is made of ferromagnetic material, its magnetic permeability is greater than zero; hence, the two pads 22 and 23 concentrate the lines of field within and parallel to the pads themselves. Since the lines of field are concentrated parallel in each pad, the pad 22 or the pad 23 is magnetized in a direction parallel to the plane. Since the two pinning lines 31 and 32, as shown in FIG. 6a, are traversed by currents i1 and i2 of opposite directions, the two pads 22 and 23 are in an antiparallel configuration of magnetization.

The sensitivity and dynamic range are a function of the current in the pinning lines 31 and 32 and of their shape so that it is possible to operate always in the same area of linearity, by changing the pinning currents i1 and i2 of the pinning lines 31 and 32. With the pinning currents i1 and i2 it is possible to render the system independent of the variations of the air gap, i.e., of the distance between the source of magnetic field and the device.

Magnetization by means of pinning currents affords an important advantage. In fact, the higher the currents, the higher the pinning fields. In the condition where the two currents are equal and opposite, the fields generated by the pinning lines block the magnetization of the pads with a magnetic force depending upon the field generated thereby. The wall formed is squeezed and compressed by the two magnetizations of the pads. If the pads are in a state of saturation, the maximum compression force on the magnetic wall is obtained, even though, in addition to magnetizing the pads, the fields generated by the pinning lines are added to the fields produced by the magnetized pads and act on the wall itself, compressing it. A more compressed wall is, in fact, thinner and less free to move. Since to a thinner wall corresponds a higher magnetization gradient; it is, in fact, possible that two consecutive moments of magnetic dipole form between them an angle of 90°; the wider the angle formed by said moments of dipole, the higher the external field required for displacing the wall.

It is, therefore, envisaged to control the dynamic range, the switching fields, and the slope of the magnetization curve as a function of the pinning currents.

This proves particularly advantageous in the case where the aim is to change the curve of response of the sensor during operation. This can be useful in different circumstances, such as, for example, in the case of variations in temperature of the place where the sensor is housed, which bring about a change in the characteristic of the sensor: by varying the pinning currents, it is hence possible to restore the curve to the optimal values.

By means of the pinning currents i1 and i2, the pinning field, i.e., the pinning magnetizations $M_1$ and $M_2$, the shape and thickness of the wall and, consequently, the resistance of the domain wall 25, and the switching field $H_{switch}$ are changed. All the electrical and magnetic parameters of the device are controllable. The higher the currents, the lower the mobility of the wall in the nanochannel.

The current lines can have different shapes (they may even be planar, two-dimensional, coils or three-dimensional coils) and directions.

According to the invention, a magnetoresistive network is proposed, which is responsive, in terms of variations of resistance, to an external magnetic field to be measured or to a control magnetic field, said network envisaging the use of magnetoresistive elements with a nanoconstriction structure according to the various embodiments 10, 20 or 30.

According to one aspect of the invention, it is envisaged to exploit the possibility of controlling the value of the switching field $H_{switch}$ through the variation in shape and dimensions of the nanochannel.

In particular, the application of the magnetoresistive network according to the invention as magnetometric apparatus is now described. In order to illustrate the magnetometric apparatus proposed reference will now be made to magnetoresistive elements 10 with a nanochannel with constant cross section and a magnetoresistive response of the type shown in FIG. 3.

The magnetometric apparatus according to the invention substantially envisages providing a magnetoresistive network by electrically connecting a plurality of magnetoresistive elements 10 having different parameters. If a voltage or a current is applied to an input of said magnetoresistive network and a current or voltage is measured at output from said electrical network, the presence of magnetoresistive elements 10 having different parameters determines a behaviour as digital magnetometer with multiple thresholds.

As will be exemplified in detail in what follows, preferred embodiments envisage the connection in series or in parallel of the magnetoresistive elements; however, it is clear that the topology of the electrical network is not limited only to said structures.

A first embodiment of magnetometric apparatus based upon an in-series connection structure, designated as a whole by the reference 100, is now illustrated with reference to FIG. 7.

Said magnetometric apparatus comprises a set of sensor devices D1 . . . Dn set in series, to which there is sent a constant sense current $i_{sen}$, whilst a value of series voltage Vser due to the sum of voltage drops V1 . . . Vn on each of said sensor devices D1 . . . Dn is measured. Each of said sensor devices D1 . . . Dn comprises a magnetoresistive element 10, which is configured so as to present a different respective switching field $H_{switch1}$ . . . $H_{switchn}$.

Hence, each sensor device D1 . . . Dn is also configured for switching between a respective value of in-channel resistance $R_{1in}$ . . . $R_{nin}$ and a value of out-of-channel resistance $R_{1out}$ . . . $R_{nout}$ at the corresponding value of switching field $H_{switch1}$ . . . $H_{switchn}$. In this way, for each i-th sensor device Di, where i is an index that identifies the position, the corresponding voltage drop Vi at constant sense current $i_{sen}$ assumes two values $V_{DWini}$ and $V_{DWouti}$. In the embodiment of FIG. 7, moreover, said values of different switching field $H_{switch1}$ . . . $H_{switchn}$ are in increasing order, i.e., $H_{switch1} < H_{switch2}$ . . . $< H_{switchn}$. The external magnetic field $H_{extx}$ is assumed uniform throughout the magnetometric apparatus 100. In such conditions, if for the external magnetic field the condition whereby $H_{switch1} < H_{extx} < H_{switch2}$ arises, then the only switching of the sensor device D1 occurs between its own values of in-channel resistance $R_{in1}$ and out-of-channel resistance $R_{out1}$. If, instead, the external field is such that $H_{switch2} < H_{extx} < H_{switch3}$, the sensor device D1 and the sensor device D2 switch. Hence, increasing the value of the external field $H_{extx}$ all the sensors D1 . . . Dn switch progressively.

FIG. 9 shows a diagram that gives a possible pattern of the external field $H_{extx}$ to be measured as a function of time t, compared with partial sums of the values of the switching fields $H_{switch1}$ . . . $H_{switchn}$.

FIG. 8 shows a graph in time of the value of series voltage Vser at output from the magnetometric apparatus 100, which reflects the time pattern of the external field $H_{extx}$ shown in the diagram of FIG. 9. Said diagram of FIG. 8 shows levels of constant voltage between two subsequent values of switching fields, which correspond of course to the sum of the voltage drops $V_{DWini}$ and $V_{Dwouti}$ due to the high value of in-channel resistance $R_{DWini}$ or low value of out-of-channel resistance $R_{Dwouti}$ assumed respectively by each device D1 . . . Dn. Consequently, as may be noted in FIG. 8, the value of series voltage Vser varies between quantized voltage levels.

Each individual sensor device D1 . . . Dn of the magnetometer 100 can be designed to obtain recognition of the switching fields within a neighbourhood of some fractions of oersted enabling a high-precision detection.

Using in the magnetometric apparatus 100 sensor elements like the device 30 of FIG. 5a, i.e., associating pinning lines to each device D1 . . . Dn, it is possible to change for each device D1 . . . Dn the respective switching field $H_{switch1}$ . . . $H_{switchn}$. This can occur, in particular, during operation of the magnetometric apparatus 100, enabling detection of magnetic fields of different intensity at different moments.

The same operation can be carried out on the time scale using one and the same sensor controlled in time by different pinning currents. For example, through a nanoconstriction 30 with constant cross section (but the present example may be readily extended to a network of nanoconstrictions) the external magnetic field $H_{ext}$ is measured in a time T corresponding to a certain number of periods of clock of a hypothetical measurement system. Said external field is substantially constant on the interval T. Applying pinning currents i01 and i02 at an instant t0, a certain set of magnetoresitive characteristics CMR0 (switching field, dynamic range, sensitivity) of the nanoconstriction 30 is determined. At instant t0, i.e., at the first clock impulse, the output resistance of the nanoconstriction 30, which depends upon the external field $H_{ext}$, is hence read and a check is made to verify whether there has been switching due to overstepping of the switching field $H_{switch}$ or not, attributing to the state verified a logic one and a logic zero, respectively. In the case where switching has occurred, the external field $H_{ext}$ is higher than the switching field $H_{switch}$. At an instant t1>t0, the value of the switching field $H_{switch}$ is hence increased by appropriately increasing the pinning currents to values i11 and i12. Then, the value of resistance of the nanoconstriction 30 is again acquired, and the logic state is determined. The values of resistance or the logic states acquired sequentially are stored, for example in a register, so that a binary string of the type 11111110 . . . or else 11110 . . . is obtained, from which it is possible to determine the external field $H_{ext}$. The values of the switching fields can be varied always by the same amount, but also by arbitrary amounts. Of course, what has been described above can be applied also to variable-section nanoconstrictions, and for networks of a series, parallel or combined type.

FIG. 10 represents a magnetometric apparatus 200 that envisages arranging the sensors D1 . . . Dn in a parallel connection. As in the case of the magnetometric apparatus 100 with series structure, each of the sensors D1 . . . Dn connected in parallel switches to a value of switching field $H_{switch1}$ . . . $H_{switchn}$ of its own between a respective value of in-channel resistance $R_{1in}$ . . . $R_{nin}$ of its own and a value of out-of-channel resistance $R_{1out}$ . . . $R_{nout}$ of its own.

The sensors D1 . . . Dn are supplied by a common voltage V, so that each branch of the parallel structure is traversed by a respective current ip1 . . . ipn that substantially can assume two values, according to whether the i-th sensor Di on the branch presents the value of in-channel resistance $R_{iin}$ ($i_{1DWout}$ . . . $i_{nDWin}$) or the value of out-of-channel resistance $R_{iout}$ ($i_{1DWout}$ . . . $i_{nDWout}$).

A current $i_{par}$ at output from the apparatus 200 is given by the sum of the currents ip1 . . . ipn. From the value of output current $i_{par}$ it is hence possible to deduce the intensity of the external field $H_{extx}$.

FIG. 11 represents the graph in time t of the output current $i_{par}$, corresponding to a graph in time of the external field $H_{extx}$ like the one given in the diagram of FIG. 9. Said output current $i_{par}$ assumes levels according to the sum of the currents in the parallel branches, for example between the sum $i^{1DWout} + i_{2DWout} + i_{3DWout} + \ldots i_{nDWout}$ and the sum $i_{1DWout} + i_{2DWin} + i_{3DWin} + \ldots i_{nDWin}$.

The values of switching field $H_{switch1}$ . . . $H_{switchn}$ are also in this case in a order increasing with the index i, namely, $H_{switch1} < H_{switch2}$ . . . $H_{switchn}$, and the external field $H_{extx}$ is uniform throughout the device.

Also in this case, using in the magnetometric apparatus 200 sensor elements like the device 30 of FIG. 5a, i.e., associating pinning lines to each device D1 . . . Dn, it is possible to change for each device D1 . . . Dn the respective switching field $H_{switch1}$ . . . $H_{switchn}$. This, in particular, can occur during operation of the magnetometric apparatus enabling detection of magnetic fields of different intensity at different moments. The same operation can be performed on the time scale by means of one and the same sensor controlled in time by different pinning currents, in a way similar to what has been described previously in relation to the magnetometric apparatus 100. In general, it will be possible, as has been said, to use different magnetoresistive electrical network structures, having as output quantity a current and/or a voltage.

In particular, one embodiment envisages use of electrical networks of magnetoresistive elements to provide calculation logics controllable by means of an external magnetic field.

The networks of FIG. 7 and FIG. 10, in fact, can be used exploiting the external magnetic field as control quantity, instead of as measured quantity. In other words, a magnetic field of a pre-set intensity is generated to obtain a pre-set value of network resistance from the values of switching field of each device. In the case where the network present is of a parallel type, for example, the output can present different binary words if the entire device is subjected to the same external field. In the case where the output is serial, by varying in time the external field in a controlled way, it is possible to present at output bits, or in any case logic levels, and write serial words in time. Of course, also in this case, it is possible to have any network configuration, with combinations of series, parallel, ladder, or bridge topologies, or the like, according to the transfer function that it is desired to obtain.

In this case, the external control field $H_{ext}$ can also be produced by the pinning lines themselves, which can also produce a specific magnetic field for each elementary sensor. FIGS. 12a and 12b show, purely by way of example, how the sensor device 30, when the currents i1 and 12 in the pinning lines 31 and 32 operate as control signals, executes substantially a logic function XOR with the inputs constituted by the pinning currents i1 and i2, in so far as, when their values are the same (logic 0, or logic 1) the device 30 has a high resistance $R_{DWin}$, whilst, when they have different values, the device 30 has a low resistance $R_{DWout}$.

With reference to a structure of a parallel type like the one shown in FIG. 10, the parallel current branches can, for example, constitute the bitlines of a calculation logic, whereas pinning lines can constitute the wordlines.

The solution according to the invention may be extended also to memory elements controllable by means of an external magnetic field (Magnetic RAMS). Also in this case, the external field $H_{extx}$ is produced by the pinning lines, which can also produce a specific magnetic field for each elementary sensor.

FIG. 13 shows a possible embodiment of a memory element 40 which uses the pads 22 and 23 associated to pinning line 31 and 32. However, said memory pads 22 and 23 are connected by means of a nanochannel 41, which is modulated so as to present two restrictions 50 and 50'. In this way, a magnetic wall 55, with appropriate values of the pinning currents i1 and i2, can remain confined in one or in the other restriction 50 and 50', as well as outside the nanochannel 41, so determining three possible values of resistance, which correspond to three different states stored. The memory is of a nonvolatile type, in so far as the magnetic wall 55, even when the pinning currents i1 and i2 stop flowing, remains in the same position.

It is to be noted that, in each elementary device, the ratio between the dimensions of the nanochannel and the dimensions f the complete device constituted by the ensemble of the nanochannel, pads and wires, must preferably be as high as possible in order not to bring about a marked reduction in the difference between the resistance R(H) of the complete device caused by the external magnetic field and the fixed resistance R(0) of the pad-wire system, which do not depend upon the external magnetic field.

If we define as a ratio MRratio=(R(0)−R(H))/R(0), the numerator depends only upon the phenomena that involve the nanochannel.

The dimensions of the nanochannel are to be compared with the dimensions of the magnetic wall, which are the real cause of the DW magnetoresistance. The nanochannel must be as short as possible. Said parameter must be defined as a compromise between high values of the ratio MRratio (the shorter the nanochannel, the higher said ratio) and wide dynamic range (with a long nanochannel, the wall has more space for its deformation).

The device can be made according to at least two configurations:
   current in plane (CIP), where the nanochannel is planar; said configuration can be obtained by ion-milling, focused-ion-beam techniques, electron-beam lithography, or deep photolithography; and
   current perpendicular to plane (CPP); to do this, it is necessary to have available porous matrices and processes for filling the pores to obtain vertical channels.

The latter can be obtained by means of:
   electrodeposition of ferromagnetic metals, magnetic semiconductors, and rare earths in nonoporous matrices. Said matrices can be obtained via:
      polymeric track-etched templates, obtained by high-energy ion bombardment on materials such as polycarbonate or polyamide;
      anodized porous alumina;
      ion-milling, focused ion beam, electron-beam lithography, or deep photolithography; and
      nanoindentation obtained using an atomic-force microscope or scanning-tunnelling microscope;
   the density of the pores can vary, with diameters of between 1 nm and 500 nm, and pore depth of between 30 nm and 1000 nm;
   sputtering and CVD of the same materials in the same matrices as those mentioned above.

Once the nanochannel is obtained, it is coated with oxide, and the pinning lines are made on top by ion-milling, focused-ion-beam techniques, electron-beam lithography, deep photolithography, and classic photolithography.

For the initial packaging a cap layer such as SiC, alumina, silicon oxides or other refractory oxides may be used.

The solution just described enables considerable advantages to be achieved as compared to the known solutions.

Of course, without prejudice to the principle of the invention, the details of construction and the embodiments may vary widely with respect to what is described and illustrated herein purely by way of example, without thereby departing from the scope of the present invention.

It is clear that each of the networks proposed as example may use nanoconstrictions with constant-section channel, nanoconstrictions with variable-section channel, as well as nanoconstrictions with channel with constant or variable section associated to pinning lines, or combinations thereof.

The ferromagnetic pads may have associated thereto permanent magnetizations, for example, provided by a process of deposition in an orientation magnetic field. In particular, said pads in the form of permanent magnets can be obtained by a spring-magnet multilayer, i.e., substantially a bilayer constituted by a first layer with high coercivity and low saturation, and a second layer with high saturation and low coercivity coupled by means of layer-layer exchange interaction. The high-coercivity layer magnetizes the high-saturation layer and constrains the magnetization thereof even when the entire bilayer is subjected to opposite fields that are much more intense than the coercive field of the high-saturation layer. The result is a thin-film permanent magnet with high magnetic induction. The resultant hysteresis cycle has a high energy product between the coercive field of the bilayer and its remanence field. The definition "spring magnet" includes systems of antiferromagnetic layers (IrMn, FeMn, etc.) and high-remanence layers (FeCo, FeCoB, etc.), which are normally used in the art as hard layers in spin-valve devices. Also in this case, the layers are coupled to one another by layer-layer exchange interaction.

The invention claimed is:

1. A magnetoresistive network responsive to a magnetic field of the type comprising a plurality of magnetoresistive elements, wherein one or more said plurality of magnetoresistive elements comprise at least one magnetoresistive element in the form of nanoconstriction, said nanoconstriction comprising at least two pads made of magnetic material, associated to which are respective magnetizations oriented in directions substantially opposite to one another and connected through a nanochannel, said nanochannel being able to set up a domain wall that determines an electrical resistance of said nanoconstriction as a function of the position, with respect to said nanochannel, of said domain wall formed in a sensor device.

2. The magnetoresistive network according to claim 1, wherein said nanochannel has a variable cross section along an axis of the nanochannel.

3. The magnetoresistive network according to claim 2, wherein said variable cross section assumes maximum values at the ends of the nanochannel and a minimum value in a substantially mid point of said nanochannel.

4. The magnetoresistive network according to claim 1, wherein said nanoconstriction comprises current lines, which carry pinning currents, comprising at least one component perpendicular to the axis of the nanochannel, said pinning currents being designed to change for each device the value of the respective switching field.

5. The magnetoresistive network according to claim 2, wherein said pads are obtained via permanent magnetic materials.

6. The magnetoresistive network according to claim 1, wherein said at least two pads comprise a first ferromagnetic pad and a second ferromagnetic pad that are configured geometrically for further controlling parameters of the hysteresis cycle, said parameters of the hysteresis cycle including the slope and/or the curvature and/or the coercive field and/or the saturation field and/or the remanence field.

7. The magnetoresistive network according to claim 6, wherein said first ferromagnetic pad and/or said second ferromagnetic pad are configured with values of size and/or of distance between them calculated as a function of a desired mobility of the moments of magnetic dipole present in the nanochannel.

8. The magnetoresistive network according to claim 3, wherein it is configured for forcing in said pinning lines currents designed to magnetize the pads of the nanoconstriction in an antiferromagnetic configuration so as to bring about nucleation of the domain wall.

9. The magnetoresistive network according to claim 3, wherein it is configured for modulating the pinning currents during operation for compensating for variations in temperature and/or variations of airgap.

10. The magnetoresistive network according to claim 3, wherein it is configured for modulating the pinning currents for controlling the dynamic range of said sensor device and/or the switching fields and/or the slope of its magnetization curve.

11. The magnetoresistive network according to claim 1, wherein it is of the current-in-plane type and the nanochannel is planar.

12. The magnetoresistive network according to claim 1, wherein said sensor device is of the current-perpendicular-to-plane type and the nanochannel is vertical and obtained in a porous matrix.

13. The magnetoresistive network according to claim 1, wherein said magnetoresistive elements are at least in part arranged in series and have a respective switching field.

14. The magnetoresistive network according to claim 13, wherein said magnetoresistive elements set in series receive a constant sensing current and produce at output a series voltage value due to the sum of the voltage drops on each of said magnetoresistive elements.

15. The magnetoresistive network according to claim 13, wherein said magnetoresistive elements are at least in part set in parallel and have a respective switching field.

16. The magnetoresistive network according to claim 13, wherein said magnetoresistive elements set in parallel receive a constant voltage and produce at output a value of parallel current due to the sum of parallel currents that traverse each of said magnetoresistive elements.

17. The magnetoresistive network according to claim 13, wherein it is comprised in a magnetometric apparatus.

18. The magnetoresistive network according to claim 1, wherein it is configured according to a calculation logic scheme that can be controlled by an external magnetic field.

19. The magnetoresistive network according to claim 18, wherein said calculation logic envisages use of the pinning lines to apply said magnetic field to which said network is responsive.

20. The magnetoresistive network according to claim 1, wherein it is configured for providing memory elements controllable by means of an external magnetic field, said external field being produced by the pinning lines.

21. The magnetoresistive network according to claim 20, wherein said memory elements comprise a nanochannel modulated with a plurality of restrictions.

22. The magnetoresistive network according to claim 20, wherein said pinning lines determine a specific magnetic field for each magnetoresistive element.

23. The magnetoresistive network according to claim 10, wherein it is configured for modulating the pinning currents for controlling the dynamic range of said sensor device and/or the switching fields and/or the slope of its magnetization curve by varying values of said pinning currents in time.

24. A method for detecting magnetic fields that envisages detecting a magnetic field by measuring a magnetic control field, wherein it envisages use of a magnetoresistive network according to claim 1.

* * * * *